United States Patent [19]

Pumphrey

[11] Patent Number: 5,308,198
[45] Date of Patent: May 3, 1994

[54] METHOD AND APPARATUS FOR DRILL LENGTH COMPENSATION

[76] Inventor: Dennis M. Pumphrey, 5012 Ruby St., Torrance, Calif. 90503

[21] Appl. No.: 931,155

[22] Filed: Aug. 17, 1992

Related U.S. Application Data

[63] Continuation-in-part of Ser. No. 780,881, Oct. 23, 1991, Pat. No. 5,139,376.

[51] Int. Cl.$^5$ ............................................. B23B 35/00
[52] U.S. Cl. ............................... 408/1 R; 364/474.18; 408/3; 408/13; 408/53; 408/95
[58] Field of Search ............ 408/1 R, 3, 13, 53, 408/95, 97; 364/474.02, 474.17, 474.18

[56] References Cited

U.S. PATENT DOCUMENTS

| | | |
|---|---|---|
| 3,973,863 | 8/1976 | Smith . |
| 4,037,982 | 7/1977 | Clement . |
| 4,088,417 | 5/1978 | Kosmowski . |
| 4,310,269 | 1/1982 | Neu et al. . |
| 4,326,824 | 4/1982 | Lasermann et al. ............... 408/1 R |
| 4,468,159 | 8/1984 | Oster . |
| 4,520,551 | 6/1985 | Imhof . |
| 4,658,094 | 4/1987 | Clark . |
| 4,761,876 | 8/1988 | Kosmowski . |
| 4,813,825 | 3/1989 | Kosmowski . |
| 4,822,219 | 4/1989 | Wood et al. . |
| 4,865,494 | 9/1989 | Gudow . |
| 4,915,550 | 4/1990 | Arai et al. . |
| 4,917,547 | 4/1990 | Frederickson et al. . |
| 4,984,352 | 1/1991 | Reed et al. . |
| 5,087,156 | 2/1992 | Kanaya et al. . |
| 5,139,376 | 8/1992 | Pumphrey ............................ 408/95 |

FOREIGN PATENT DOCUMENTS

| | | |
|---|---|---|
| 386378 | 3/1989 | European Pat. Off. . |
| 2539120 | 9/1975 | Fed. Rep. of Germany . |
| 869256 | 1/1942 | France . |
| 61-86156 | 5/1986 | Japan . |
| 188207 | 7/1989 | Japan . |
| 243210 | 9/1990 | Japan . |
| 06167 | 4/1987 | PCT Int'l Appl. . |

OTHER PUBLICATIONS

One page brochure regarding Posalux SA.

*Primary Examiner*—Daniel W. Howell
*Attorney, Agent, or Firm*—Knobbe, Martens, Olson & Bear

[57] ABSTRACT

One aspect of the invention is a method of rapidly drilling holes in a workpiece on a drilling machine having first and second spindles holding first and second drill tools, a first and second pressure foot mounted on the first and second spindles and a work table mounted beneath the spindles on which workpieces can be mounted. The method includes selecting a workpiece having a thickness, defining a nominal vertical home position for the first and second spindles, such that in the home position there is a nominal clearance distance between the bottom surface of the spindle's pressure foot and the top surface of the workpiece to be positioned beneath the spindle, measuring a drill tool offset distance for the first and second spindles such that the drill tool offset distance is equal to the distance between the bottom surface of the pressure foot of the spindle and the tip of the drill tool mounted in the spindle, compensating for the drill tool offset distance by designating a vertical upper limit for the first spindle and a vertical upper limit for the second spindle such that when the first and second spindles are at their respective upper limits, the tips of their respective drill tools are positioned in equal distance from the top surface of the work table, and accordingly, the top surface of the workpiece mounted thereon.

11 Claims, 8 Drawing Sheets

METHOD AND APPARATUS FOR DRILL LENGTH COMPENSATION

RELATED APPLICATIONS

This application is a continuation-in-part of co-pending U.S. patent application Ser. No. 07/780,881, filed Oct. 23, 1991, now U.S. patent application Ser. No. 5,139,376 entitled "Method and Apparatus for Controlled Penetration Drilling."

FIELD OF THE INVENTION

The present invention relates generally to the field of printed circuit board drilling machines and, in particular, to an improved method and apparatus for drilling printed circuit boards to increase the productivity of such drilling machines by compensating for the length of a drill tool during a drilling stroke.

BACKGROUND OF THE INVENTION

In the manufacture of printed circuit boards, frequently literally thousands of small holes must be drilled into each printed circuit board. In volume production of the circuit boards, the drilling of holes is accomplished by computer controlled automatic drilling machines in which the printed circuit boards are usually mounted on a worktable which is movable in a horizontal X-Y plane. A sheet of back-up material is typically mounted on top of the worktable, and beneath the printed circuit boards, so that the drill tool does not drill into the worktable upon passing through the underside of the printed circuit board.

Usually, the worktable moves horizontally to be positioned under a spindle having a drill tool mounted therein, so that the holes may be drilled at appropriate drilling locations. Drilling of the circuit boards is accomplished by advancing each drill spindle downward through a vertical drilling stroke.

A vital concern in the field of printed circuit board drilling machines is the speed with which a machine can drill holes. This is usually referred to as the productivity or "throughput" of a drilling machine. Although the time it takes to drill any single hole is relatively small, each circuit board drilled usually requires drilling thousands of holes, for example as many as 20,000 or more holes per board. Consequently, any small variance in the time to drill a single hole has a greatly multiplied effect and is very significant in the long term.

Another concern is that of minimizing drilling of the back-up material. When holes are drilled completely through a printed circuit board, the tool must penetrate the back-up material to some degree in order for the drill hole to be uniform throughout the entire depth of the circuit board. However, it is desirable to minimize the amount of penetration into the back-up material because the time required for such drilling lengthens the drill stroke and also causes wear of the drill. Further, circuit boards are commonly drilled in stacks. The deeper the hole is to be drilled, the longer the drill tool must be. In turn, the longer a drill tool is relative to its diameter, the more easily the tool will break. By decreasing the depth of tool penetration into the back-up material, shorter tools can be used for a given diameter hole, thus decreasing the likelihood of tool breakage.

Prior art through drilling techniques have not been satisfactory in satisfying these performance criteria. Prior art machines include a sensor to determine the vertical position of the drill spindle, and in turn the tip of the drill tool which extends a nominal distance from the spindle. One approach has been to simply drill to a preselected vertical position which is sufficiently deep to insure that the workpiece is fully drilled through. However, to accommodate several variables, the preselected depth must be so far beneath the top surface of the backup material to result in substantial amounts of unnecessary drilling of back-up. For example, the back-up material is not perfectly planar, and thus the position of its top surface can only be estimated. Further, due to drill wear, the precise position of the tip of the drill tool changes. During use, the drill tools gradually become worn and thus they become measurably shorter over time. Prior to drilling into a workpiece, therefore, the vertical or Z-axis position of the tip of a worn drill tool is often higher than its expected position, namely, the Z-axis position of the tip of a new, unworn drill.

Using this prior art technique in a multi-spindle drilling machine, all the drill tools penetrate beyond the workpiece and into the back-up material below the workpiece so that even the worn drill tools will be ensured of drilling completely through the workpiece. As a result, unworn and only nominally worn drill tools drill unnecessarily deep into the back-up material, causing lost time during unnecessary drill movement. Additionally, drilling into the back-up material causes further wear of the drill tool, and causes loosened particles of the back-up material to be carried up into and embedded into the walls of the hole drilled in the workpiece, thereby decreasing the quality of the hole.

One solution to the above problem is to frequently replace all the drill tools on the drilling machine with new, unworn drill tools. This solution, however, is unnecessarily expensive and wastes drill tool which could otherwise be sharpened and reused.

Another approach has been to use a technique designed for drilling holes only partially through a workpiece, called "depth control drilling." In depth control drilling, the variance or "offset" in vertical position of a worn drill tool from the nominal position of a new drill tool is determined before drilling begins, so that the precise vertical position of the tip of the drill tool is known. When the drill stroke is commenced, the depth of the hole is measured from the top of the workpiece. This reference position is sensed when a pressure foot, which is attached to the drill spindle, engages the top of the workpiece. When the desired depth is reached, the drill stroke is terminated. This technique is adapted to through-drilling by treating the depth of the hole to be drilled as equal to the thickness of the workpiece or stack of workpieces desired to be through-drilled.

The shortcoming of using the depth control technique for through-drilling is that sensing the vertical position of the top surface of the workpiece, from which the depth of the hole is measured, can be inexact. For example, inaccuracies arise due to debris on top of the workpieces. Likewise, an assumption must be made regarding the thickness of the workpiece which is being drilled in order to determine how deep the hole must be in order to drill completely through the workpiece. This assumption may be inaccurate since waviness in the workpieces can result in varying workpiece thicknesses depending on the location at which the hole is being drilled. These inaccuracies are multiplied when several printed circuit boards are stacked for through-drilling. Also, debris between stacked workpieces can cause variation in workpiece thickness.

Thus, a method is needed for preventing unnecessary loss of time during drilling by eliminating unnecessary drill movement during the drilling of printed circuit boards in order to improve the productivity of drilling machines.

SUMMARY OF THE INVENTION

One method and apparatus for avoiding the drawbacks of prior art through drilling techniques is by mapping the back-up material before drilling to determine the precise vertical position of the back-up material and by setting hole depth at an absolute predetermined vertical position, as disclosed in copending U.S patent application Ser. No. 07/780,881 entitled "Method and Apparatus for Controlled Penetration Drilling," which is hereby incorporated herein by reference.

While this technique improves the accuracy of the drill holes and avoids excess wear on drill tools by excessive drilling of back-up material, it has been determined that it is possible to significantly increase drilling machine throughput in multi-spindle drilling machines by altering the starting and/or finishing locations of individual spindles to decrease the maximum length of drill stroke performed by any of the machines' spindles. By decreasing the maximum length of the drill stroke performed, the machine will be able to perform a given drill stroke faster, thereby increasing throughput. Desirably, the starting and/or finishing locations of the machines' spindles can be set such that the maximum drill stroke length is effectively minimized. That is, in a depth control drilling operation, the length of drill stroke is only as long as the depth of the hole desired, plus a nominal distance to provide adequate clearance between the bottom surface of the drilling machines' respective pressure feet and the upper surface of the respective workpieces. The method and apparatus of the present invention can also be applied to through drilling such that the maximum length of drill stroke performed is the thickness of the material being drilled, plus the nominal distance needed to drill into the back-up material to ensure the drill hole is uniform through its entire length, plus again a nominal distance to provide adequate clearance between the bottom surface of the drilling machines' respective pressure feet and the upper surface of the respective workpieces.

One aspect of the invention is a method of rapidly drilling holes in a workpiece on a drilling machine having first and second spindles holding first and second drill tools, a first and second pressure foot mounted on the first and second spindles and a work table mounted beneath the spindles on which workpieces can be mounted. The method includes selecting a workpiece having a thickness, defining a nominal vertical home position for the first and second spindles, such that in the home position there is a nominal clearance distance between the bottom surface of the spindle's pressure foot and the top surface of the workpiece to be positioned beneath the spindle, measuring a drill tool offset distance for the first and second spindles such that the drill tool offset distance is equal to the distance between the bottom surface of the pressure foot of the spindle and the tip of the drill tool mounted in the spindle, compensating for the drill tool offset distance by designating a vertical upper limit for the first spindle and a vertical upper limit for the second spindle such that when the first and second spindles are at their respective upper limits, the tips of their respective drill tools are positioned in equal distance from the top surface of the work table, and accordingly, the top surface of the workpiece mounted thereon. The drill spindles are then advanced downward through their vertical drilling stroke to a lower limit and are returned upward to their respective upper limits. Advantageously, this method may be used when the lower limit is either a fixed distance below the upper surface of the workpiece, less than the thickness of the workpiece (for depth control drilling) or where the workpiece is mounted on backup material and the lower limit is a fixed distance below the upper surface of the workpiece so that the drill tools penetrate a sufficient distance into the back-up material that bores formed by the drill tools in the workpiece will have a uniform cross section.

Advantageously, the compensating step can be performed by setting the upper limit of the first or second spindle a distance from the nominal home position equal to the difference between the offset distance of the first spindle and the offset distance of the second spindle. This method is desirable in that the clearance distance established is usually already a very small distance, and this method diminishes the clearance between the drill tip and the workpiece by only the distance necessary to compensate for the difference in offset between the respective drill tools.

It will be readily appreciated by one of ordinary skill in the art that this method could also be utilized by incorporating an idealized spindle in which no drill tool offset distance existed and moving each of the spindles downward from their nominal home position a distance equal to the drill tool offset distance for the given spindle.

Yet another aspect of the invention is a drilling machine for conducting the foregoing method.

DESCRIPTION OF THE PREFERRED EMBODIMENT

Figure 1:
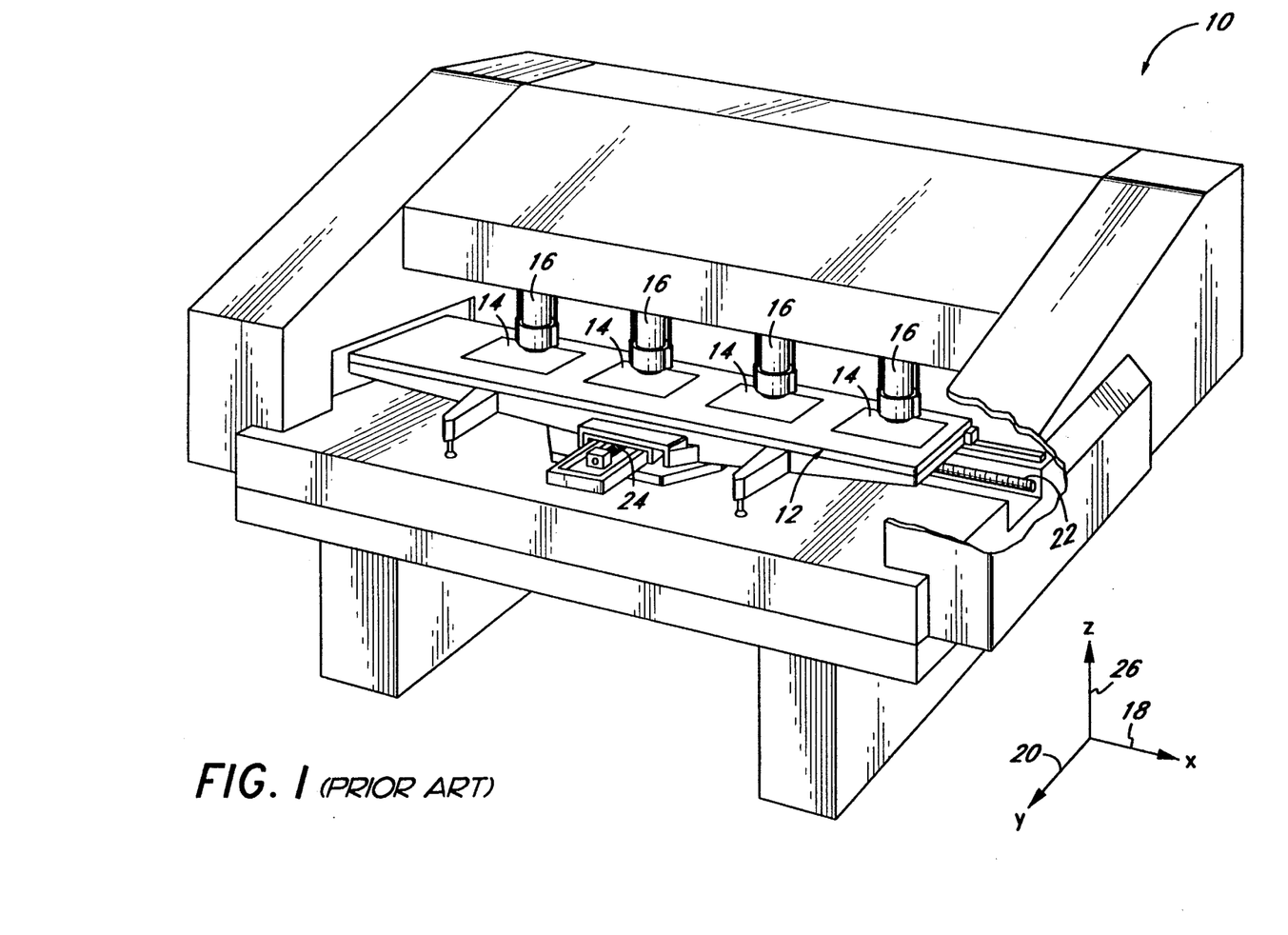
FIG. 1 is a perspective view of a typical multi-spindle printed circuit board drilling machine.

Referring to FIG. 1, a typical printed circuit board drilling machine 10 is shown. The drilling machine 10 includes a worktable 12 on which workpieces, such as printed circuit boards 14 are mounted. Above the worktable 12, one or more spindles 16 are mounted on a carriage (not shown). The worktable 12 is movable in a horizontal plane defined by an X-axis 18 and a Y-axis 20. Preferably, the worktable 12 is movable parallel to either axis 18, 20. The worktable 12 is displaced by the rotation of motor driven lead screws 22 and 24, which are parallel to the X and Y axes, respectively. As is known in the art, positioning of the worktable 12 relative to the spindle 16 on a drilling machine can be achieved by alternate arrangements, such as moving by the spindle 16 in one direction along the X-Y plane and moving the worktable 12 in the other direction.

Figure 2:
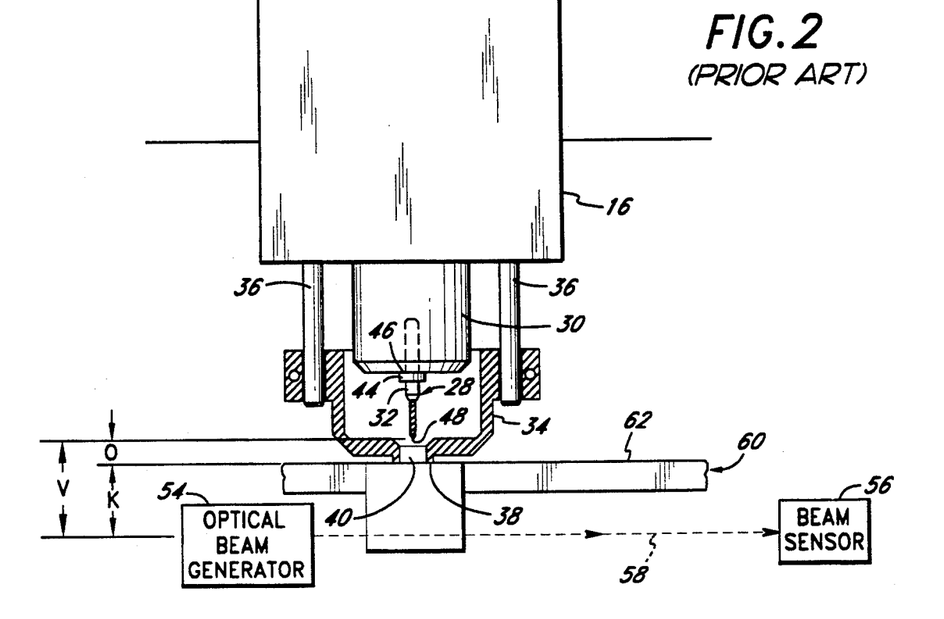
FIG. 2 is a partially cross-sectioned elevational view of drill spindle and tool measuring device.

The spindles 16 are movable in a vertical direction, parallel to a Z-axis 26. Although not shown, the spindles 16 are displaced by a motor driven lead screw arrangement of a type well known by those skilled in the art. The spindle vertical drive mechanism 27 is represented schematically in FIG. 3. As is seen in FIG. 2, a drill tool 28 is mounted in the spindle 16 so that the drill 28 depends from the bottom of the spindle 16. A collet 30 on the spindle 16 grips a cylindrical shank 32 of the tool 28. The spindle 16 is driven by a motor (not shown) to cause rotation of the drill tool 28 to effect drilling.

A pressure foot 34 is mounted beneath the spindle 16, and is movable relative to the spindle 16 in a vertical direction. The pressure foot 34 is joined to the spindle 16 by cylindrical rods 36 which are pneumatically biased so that the pressure foot 34 is forced downwardly, away from the spindle 16. A bottom surface 38 of the pressure foot 34 engages the top of the workpiece 14 during drilling normal operations. During drilling, the spindle 16 is driven downwardly so that the pressure foot bottom surface 38 engages the workpiece 14. The downward force of the spindle 16 easily overcomes the biasing force on the rods 36, so that the spindle 16 continues to move vertically downwardly, and also begins to move downward relative to the pressure foot 34. Continued downward movement of the spindle 16 causes the drill tool 28 to pass through an aperture 40 in the pressure foot 34. Relative motion between the spindle 16 and pressure foot 34 is sensed by means of a relative motion sensor 42, shown schematically in FIG. 3. Preferably, the relative motion sensor 42 is an optical limit switch.

An annular collar 44 is press fit onto the drill shank 32. A top surface 46 of the collar 44 abuts the collet 30. The collar 44 is positioned on the drill 28 so that the distance between the collar top surface 46 and a tip 48 of the drill tool 28 is a nominal value. Thus, the vertical position of the tool tip 48 is known relative to the spindle 16. The absolute Z-axis position of the spindle 16 is sensed by a spindle vertical position sensor 50, as shown schematically in FIG. 3. Those skilled in the art will appreciate that a variety of devices can be used to function as a vertical position sensor 50. Output from the vertical position sensor 50 is fed to a computer controller 52. Thus, the nominal vertical position of the tool tip 48 is known by the controller 52 at all times. The controller 52, which monitors various functions of the drilling machine 10, is preferably a digital computer which utilizes, for example, a Motorola 68020 chip as a CPU.

Figure 3:
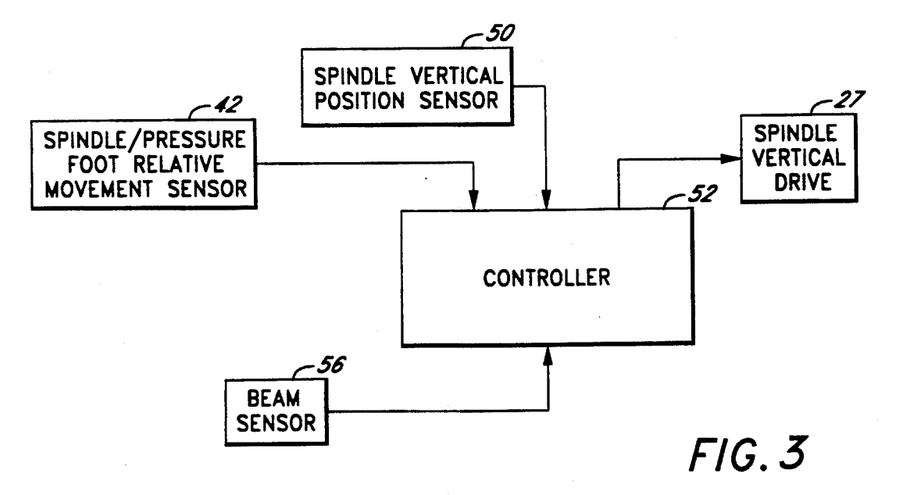
FIG. 3 is a block diagram of prior art spindle tool position sensors and a controller.

Knowing the vertical position of the spindle 16, and the distance from the collar 44 to the tool tip 48, the nominal vertical position of the tool tip 48 is known. However, due to wear of the drill tool 28, and inaccuracies in the placement of the collar 44 on the drill tool 28, the actual vertical position of the tool tip 48 may vary from the nominal position. Prior art systems have been developed to accommodate for these variations during depth control drilling. Such a prior art drill tool measuring device is shown in FIGS. 2 and 3. The device includes an optical beam generator 54 and an optical beam sensor 56. An optical beam 58 is generated by the beam generator 54. The sensor 56 determines when the beam 58 is occluded by the drill tool 28, and transmits this information to the controller 52.

Referring to FIG. 2, a tooling plate 60 having a planar upper surface 62 is mounted on the worktable 12. A distance between the upper surface 62 of the plate 60 and the sensor beam 58 is a known, factory preset value represented by the reference character "K". To measure the precise location of the tip 48 of the drill tool 28, the tool measuring device is positioned below the spindle 16, and then the spindle 16 is moved downwardly. When the pressure foot 34 engages the upper surface 62 of the plate 60, the relative motion sensor 42 sends a signal to the controller 52, and a distance counter in the controller 52 is begun.

The spindle 16 continues to move down, relative to the pressure foot 34, while the pressure foot 34 remains stationary on the plate 60. The amount of relative movement of the spindle 16 is measured by the distance counter in the controller 52 until the drill tool tip 48 interrupts the sensor beam 58. The counter value now represents the distance traveled by the spindle 16 between engagement of the pressure foot 34 with the plate 60 and intersection of the tool tip 48 with the beam 58. This distance is designated by the reference character "V," shown in FIG. 2. The value V is used by the controller 52 to derive a tool tip offset for the drill tool 76 which is designated by the reference character "O". Specifically, O is determined by the formula $V - K = O$.

The offset O represents the distance from the drill tool tip 48 to the bottom of the pressure foot 38 when the spindle 16 is in a home position. The home position or "upper limit" is a predetermined Z-axis point which is known by the controller 52 and to which the spindles 16 return after completion of each drill stroke. During measuring of the tool tip position, the spindle 16 is initially set at the home position prior to moving the spindle downward to interrupt the sensor beam 58. Thus, when the pressure foot 34 initially contacts a top surface of a printed circuit board 14 during a drill stroke, the value 0 also represents the distance from the drill tool tip 48 to the top surface of the circuit board 14 at the moment the relative movement sensor 42 senses displacement of the spindle 16 relative to the pressure foot 34. The tool tip measurement technique described above generally is used each time a drill tool 28 is changed so that the precise position of the tool tip 48 can be accommodated for during drilling.

In prior art depth control drilling, the vertical position of the tip of the drill tool must be known in order to determine how far the spindle must travel along the Z-axis for the tool tip to penetrate the workpiece to the desired depth. The first step in depth control drilling is to conduct the tool tip measurement described above with reference to FIG. 2. Then, starting the drill stroke with the spindle in the known home position and with the workpiece in position on the worktable, the spindle is first moved vertically downward a distance C (not shown), equal to the clearance between the bottom surface of the pressure foot and the top surface of the work piece, until the relative motion sensor 42 indicates that the pressure foot bottom surface 38 has engaged the workpiece. From that point, the controller signals the spindle vertical drive mechanism 27 to move downwardly a distance equal to the offset O, plus an amount "P" (FIG. 4), where P represents the amount of desired penetration below the top surface of the workpiece 14. The offset O is determined during the tool tip measurement process described above with reference to FIG. 2, and is a sufficient distance to bring the tool tip 44 into contact with the top of the workpiece. The value of P is predetermined and is input to the controller 52 by the user before the drilling operation begins.

Figure 4:
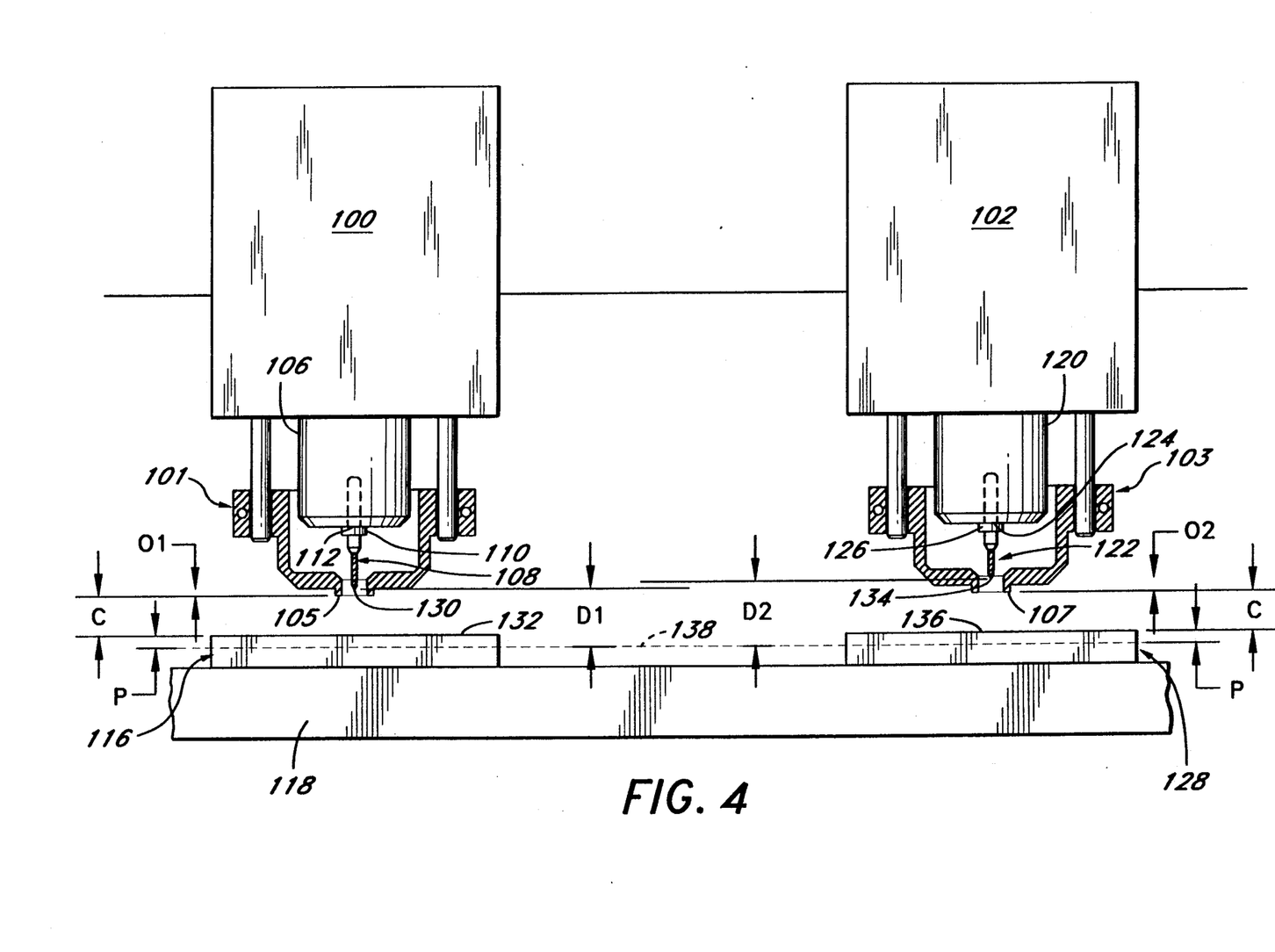
FIG. 4 is a schematic elevational view of a multi-spindle drill tool arrangement above a workpiece for depth drilling as in the prior art.

Referring to FIG. 4, a first spindle 100 and a second spindle 102 of a multi-spindle drilling machine 104 are illustrated. A first pressure foot 101 having a bottom surface 105 is mounted beneath the first spindle 100, and a second pressure foot 103 having a bottom surface 107 is mounted beneath the second spindle 102. For clarity, the spindles 100 and 102 are illustrated in their home position. The first spindle 100 is positioned to the left, as shown in FIG. 4, and has a collet 106 within which is mounted a first drill tool 108 having a collar 110, such that a top surface 112 of the collar 110 abuts the collet 106. The first spindle is positioned above a first workpiece 116 having a top surface 132. The workpiece is mounted on a work table or tooling plate 118.

The second spindle 102 is positioned to the right, as shown in FIG. 4, and has a collet 120 in which is mounted a drill tool 122 having a collar 124. A top surface 126 of the collar 124 abuts the collet 120. The second spindle 102 is positioned above a second workpiece 128 having a top surface 136, which rests upon the tooling plate 118. In the home position, the bottom surface 105 of the first pressure foot 101 is spaced a clearance distance, C, above the top surface 132 of the first workpiece. Similarly, the bottom surface 107 of the second pressure foot 103 is spaced a nominally equal clearance distance, C, above the top surface 136 of the second workpiece. This clearance distance C is generally between 0.050 and 0.060 inches.

As shown in FIG. 4, the portion of the first drill tool 108 below the collar is illustrated as being relatively long. As such, it has a tip 130 in a position spaced a nominal offset distance $O_1$ above the bottom surface 105 of the first pressure foot 101 when the first spindle 100 is in its home position. This offset distance $O_1$ is the same offset distance $O_1$ as the tip 130 is spaced from the top surface 132 of the first workpiece 114 when the pressure foot bottom surface 105 has engaged the top surface 132 of the workpiece 116. In contrast, the portion of the second drill tool below the collar is illustrated as being relatively short. That is, the distance between the tip 130 of the first work tool 108 and the collar 110 of the first work tool 108 is greater than the distance between the tip 134 of the second work tool 122 and the collar 124 of the second work tool 122. As a result, the second drill tool has a tip 134 in a position spaced a somewhat larger offset distance $O_2$ above the bottom surface 107 of the second pressure foot 103 when the second spindle 102 is in its home position. This offset distance $O_2$ is the same distance $O_2$ as the tip 134 is spaced from the top surface 136 of the second workpiece 128 when the pressure foot bottom surface 107 has engaged the top surface 136 of the workpiece 128. The difference in these offset distances $O_1$ and $O_2$ is generally no more than 0.015–0.025 inches.

A desired hole penetration depth P is entered into the controller and is equal to the distance between the top surfaces 132 and 136 of the respective workpieces 116 and 128, and the lowermost extreme of the drill tip penetration of the respective drill tools. In FIG. 4, this lowermost extreme is designated as line 138. Since the measured offset $O_2$ for the shorter second tool 122 will be greater than that of the offset $O_1$ of the longer first tool 108, the controller automatically determines that the second spindle 102 holding the shorter second drill tool 122 must make a longer drilling stroke to form holes of the desired depth P. During the drilling of the respective holes, the first spindle 100 must move a distance $D_1$ along the Z-axis from the home position to move the tip 130 of the first drill tool 108 to the desired depth limit 138 to create holes in the first workpiece 116 having the desired depth P. The second spindle 102 must move down a greater distance $D_2$ from the home position to move the tip 134 of the second drill tool 122 to the desired depth limit 138 to create holes in the second workpiece 128 of the desired depth P. Since the distance $D_2$ is greater than the distance $D_1$, the second spindle takes a longer amount of time to complete its drill stroke than does the first spindle 100.

In other words, the clearance distance between the bottom surface of the first pressure foot and the top surface 132 of the first work piece 116, C, is equal to the clearance distance between the bottom surface of the second pressure foot 103 and the top surface of the second work piece, C. Likewise, the distance equal to the amount of penetration of the first tool tip 130 through the first work piece 116, P, is equal to the amount of penetration of the second tool tip 134 through the second work piece, P. Thus, since $O_1 < O_2$, $D_1 = O_1 + C + P$ and $D_2 = O_2 + C + P$, then $D_1 < D_2$.

Once the spindles 100 and 102 have drilled to the desired depth limit 138 in their respective workpieces 116 and 128, the spindles 100 and 102 return to the home position prior to beginning another drilling stroke. Again, the second spindle 102 takes longer to return to the home position from the bottom extreme of the drilling stroke because it moves a distance $D_2$, while the first spindle 100 moves the shorter distance $D_1$.

Although the foregoing has been discussed in connection with only two spindles of a multiple spindle drilling machine 104, it will be appreciated that the multi-spindle drilling machine may have significantly more than two spindles. In this situation, it will be appreciated that the time it takes to drill a given set of holes will be determined by the shortest drilling tool held by any of the spindles because the spindle holding the shortest drill tool will need to move the greatest length before the tip of the drill tool reaches the bottom extreme of its drilling stroke, and will likewise need to wait until the spindle holding the shortest tool returns to its home position before the worktable 118 is moved in preparation for drilling a new set of holes.

In accordance with the present invention, the time required for each spindle of a multi-spindle drilling machine to drill holes of a given depth is reduced by equalizing the length of the drill stroke for each spindle. Advantageously, this method permits the time required for all the spindles to complete a given drilling operation to be minimized by providing for an optimized minimum drill stroke length for all spindles. Thus, no time is wasted by having any spindle waiting for the completion of the drilling stroke by another spindle. Desirably, the same hardware shown in FIGS. 1–4 can be utilized in the present invention.

Figure 5:
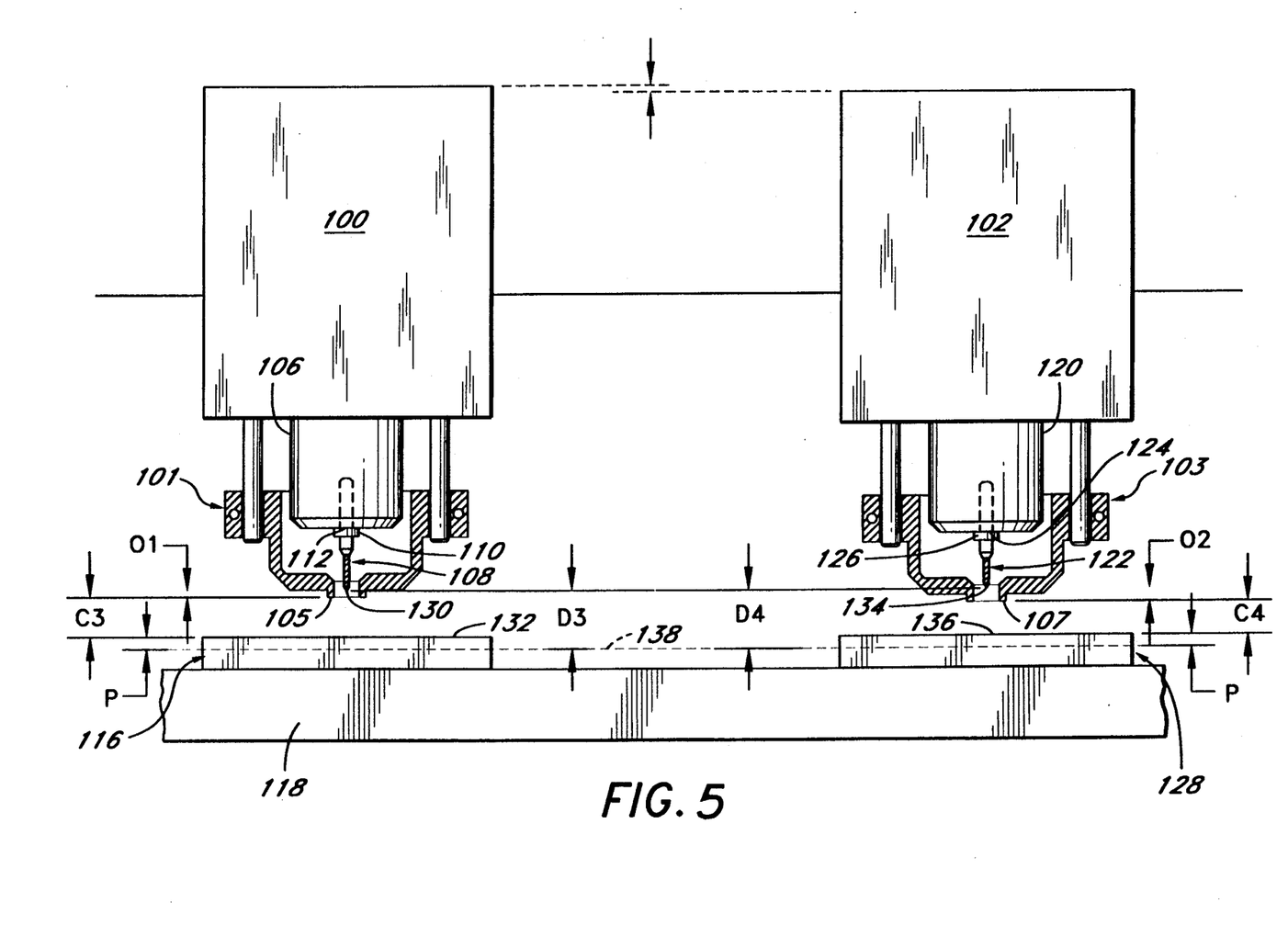
FIG. 5 is a schematic elevational view of a multi-spindle drill tool arrangement above a workpiece for depth drilling in accordance with the present invention prior to initiation of a drilling stroke.

FIG. 5 shows the identical hardware as described above in connection with FIGS. 1–4. For simplicity, like elements have been given like numerals. FIG. 5, however, shows the spindles 100 and 102 in a first position, different from the home position in accordance with the present invention. In this first position, as in the home position, the tip 130 of the first work tool 108 is spaced a nominal offset distance $O_1$ above the bottom surface 105 of the first pressure foot 101, and the tip 134 of the second drill tool 122 is spaced a somewhat longer offset distance $O_2$ above the bottom surface 107 of the second pressure foot 103. Likewise, in this first position, as in the home position, the desired hole penetrator depth P is equal to the distance between the top surfaces 132 and 136 of the respective workpieces 116 and 128 and the lowermost extreme of the drill tip penetration of the respective drill tools. Further, the bottom surface 105 of the first pressure foot 101 is spaced a clearance distance, $C_3$, above the top surface 132 of the first workpiece 116, which will generally be equal to the clearance distance C in the home position. However, in contrast to the home position, the bottom surface 107 of the second pressure foot 103 is spaced a clearance distance $C_4$ above the top surface 136 of the second workpiece 128, which is shorter than the clearance distance $C_3$ between the bottom surface 105 of the first pressure foot 103 and the top surface 132 of the first workpiece 116. This clearance distance $C_4$ will generally be shorter than the clearance distance C. Importantly, however, this clearance distance $C_4$ is chosen so that the offset distance $O_1$ added to the clearance distance $C_3$ is equal to the offset distance $O_2$, plus the clearance distance $C_4$. That is, $O_1+C_3=O_2+C_4$. As a result, since the total distance $D_3$ moved by the first spindle from the first position to the bottom end of the drill stroke is equal to $O_1+C_3+P$, and the total distance $D_4$ moved by the second spindle from the first position to the bottom end of the drill stroke is equal to $O_2+C_4+P$, then $D_3=D_4$. Thus, the drill stroke lengths are equal, and no time is wasted at the beginning or the end of the drill stroke waiting for one of the spindles to move to compensate for a shorter drill tool. Over thousands and thousands of drill strokes, such time savings can be substantial.

Figure 6:
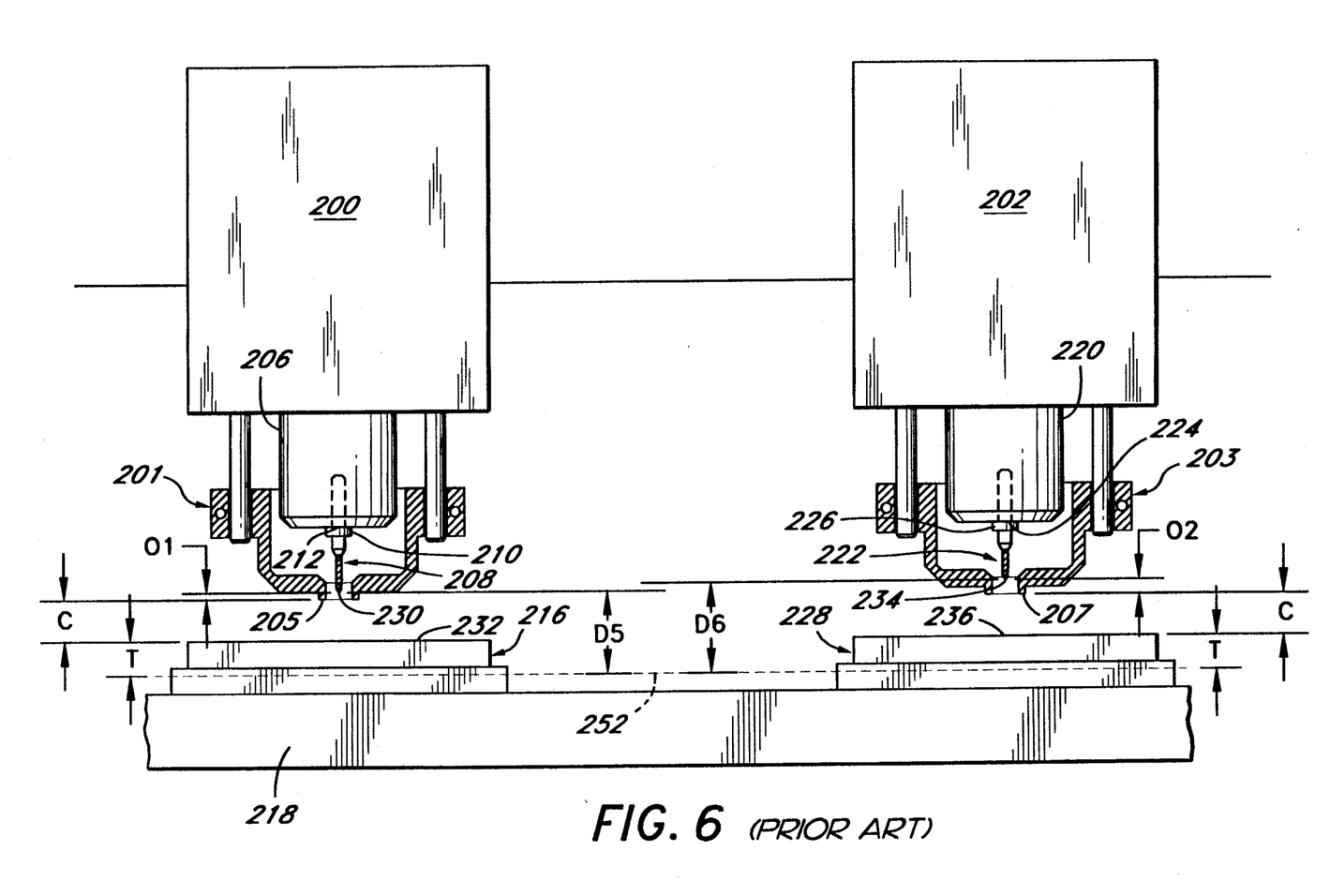
FIG. 6 is a schematic elevational view of a multi-spindle drill tool arrangement above a workpiece for through-drilling as in the prior art.
Figure 7:
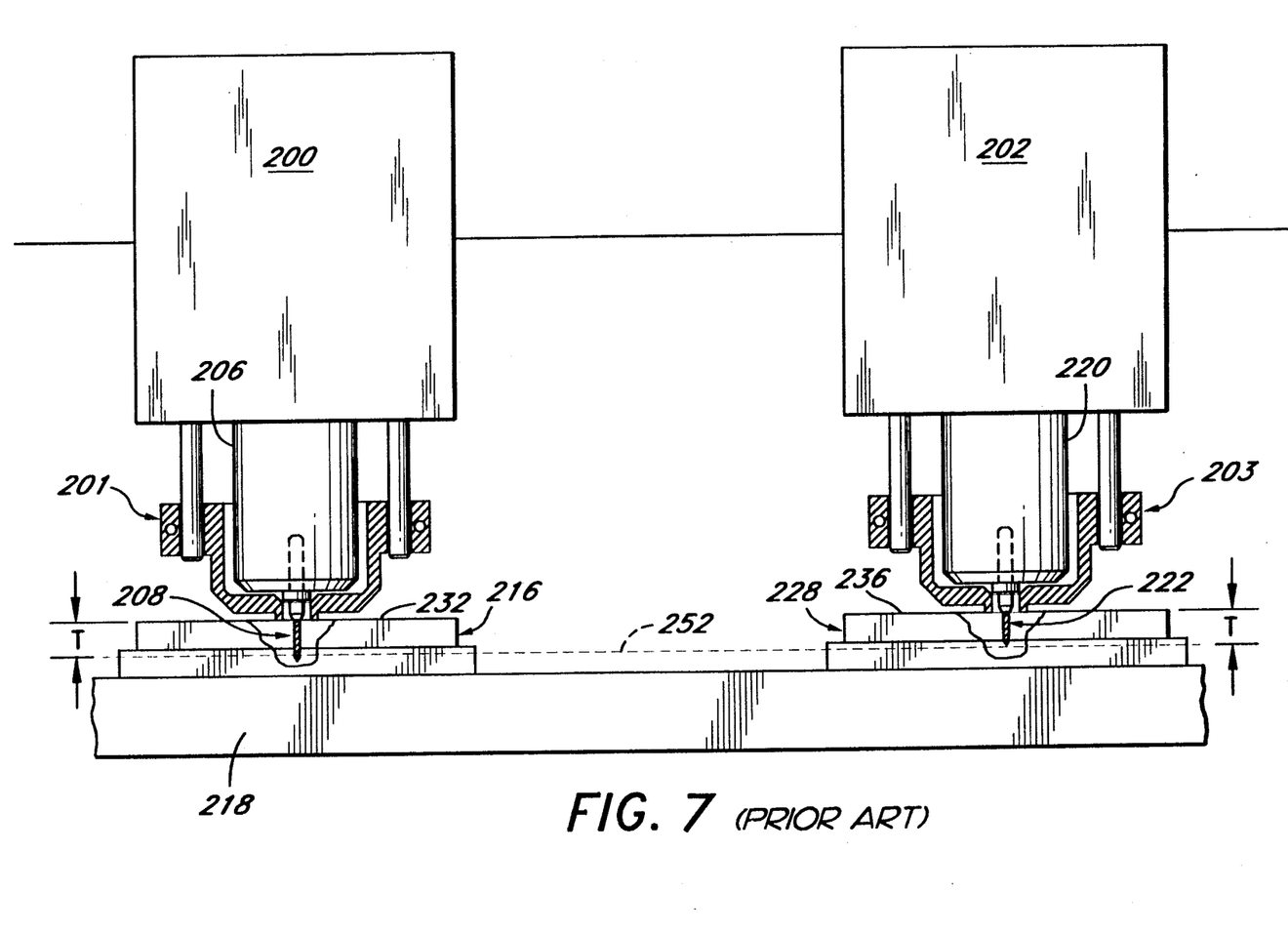
FIG. 7 is a schematic elevational view of a multi-spindle drill tool arrangement as in FIG. 6 after the drill tools have completed a downward drilling stroke.

The present inventive method also has advantageous application in through-drilling. Referring now to FIGS. 6 and 7, a method of through-drilling as typically accomplished in the prior art is illustrated. The hardware used in through-drilling is the same as that used in depth control drilling, with the exception that a sheet of back-up material 250 is utilized. Accordingly, in referring to FIGS. 7-10, like elements will be given like numbers, with the exception that the numbers will begin with 200, rather than 100.

FIG. 7 shows the spindles 200 and 202 in their home position, such that the bottom surface 212 and 226 of the collet of the first spindle 200 and second spindle 202, are in the same horizontal plane. Since the first spindle 200 is again shown holding a relatively longer work tool 208, and the second spindle 202 is shown holding a relatively shorter work tool 222, the tips 230 and 234 of the respective work tools 208 and 222 are in different horizontal planes. Specifically, the tip 234 of the second work tool 222 is spaced further from the second workpiece 228 than the tip 230 of the first tool 208 is spaced from the upper surface 232 of the first workpiece 216. Both the first workpiece 216 and the second workpiece 228 are positioned on an upper surface 252 of the sheet of back-up material 250.

This arrangement is virtually identical to that of FIG. 4. That is, a first pressure foot 201 having a bottom surface 205 is mounted beneath the first spindle 200, and a second pressure foot 203 having a bottom surface 207 is mounted beneath the second spindle 202. The first spindle is positioned above a first workpiece 216 having a top surface 232.

The second spindle 202 is positioned above a second workpiece 228 having a top surface 236. In the home position, the bottom surface 205 of the first pressure foot 201 is spaced a clearance distance, C, above the top surface 232 of the first workpiece. Similarly, the bottom surface 207 of the second pressure foot 203 is spaced a nominally equal clearance distance, C, above the top surface 236 of the second workpiece. This clearance distance C is generally between 0.050 and 0.060 inches.

As in FIG. 4, the portion of the first drill tool 208 below the collar is illustrated as being relatively long. As such, it has a tip 230 in a position spaced a nominal offset distance $O_1$ above the bottom surface 205 of the first pressure foot 201 when the first spindle 200 is in its home position. In contrast, the second drill tool has a tip 234 in a position spaced a somewhat larger offset distance $O_2$ above the bottom surface 207 of the second pressure foot 203 when the second spindle 202 is in its home position. The difference in these offset distances $O_1$ and $O_2$ is generally no more than 0.015-0.025 inches.

The primary distinction to the prior art depth control drilling method of FIG. 4 is that, rather than moving the tips of the drill tools a desired distance P below the top surface of the respective workpieces, the drilling machine controller must move the spindles 200 and 202 a sufficient distance downward that even the shortest drill tool, such as the shorter second drill tool 222, will extend completely through its workpiece 208 and into the backing material 252 a sufficient distance T to ensure the creation of a uniform drill through-hole.

In other words, the clearance distance between the bottom surface of the first pressure foot and the top surface 232 of the first work piece 216, C, is equal to the clearance distance between the bottom surface of the second pressure foot 203 and the top surface of the second work piece, C. Furthermore, each of the spindles 200 and 202, moves the same distance T from the upper surface of its respective workpiece, 216, 228 to ensure that the shorter second drill tool 222 will extend completely through its workpiece 208 a sufficient distance to ensure the creation of a uniform drill through-hole. Thus, the total distance $D_5$ moved by the first spindle 200 is equal to the total distance $D_6$ moved by the second spindle 202. However as the tip 230 of the first drill tool 208 begins closer to the top surface 232 of the first workpiece, than the tip 234 of the second drill tool is to the top surface of the second workpiece, as will be appreciated, the tip 230 of the first drill tool 208 extends a greater distance into the back-up material than the tip 234 of the second drill tool 222. The movement of the first spindle 200 beyond a relatively nominal distance through the workpiece 250 for purposes of ensuring a uniform through-hole in the first workpiece 216 creates unnecessary excess wear on the tip 230 of the first drill tool 208, and results in lost time to the extent that the first spindle 200 moves downward longer than the distance necessary for the tip 230 of the first drill tool to drill into the back-up material 250 this nominal amount. Thus, since the total distance moved by each spindle is the same and $O_1<O_2$, the tip 230 of the first spindle 200 extends an unnecessary distance equal to $O_2-O_1$ into the backing material 250.

Once the spindles 200 and 202 have completed their down stroke, as shown in FIG. 7, they return to the home position prior to beginning another drilling stroke.

Figure 9:
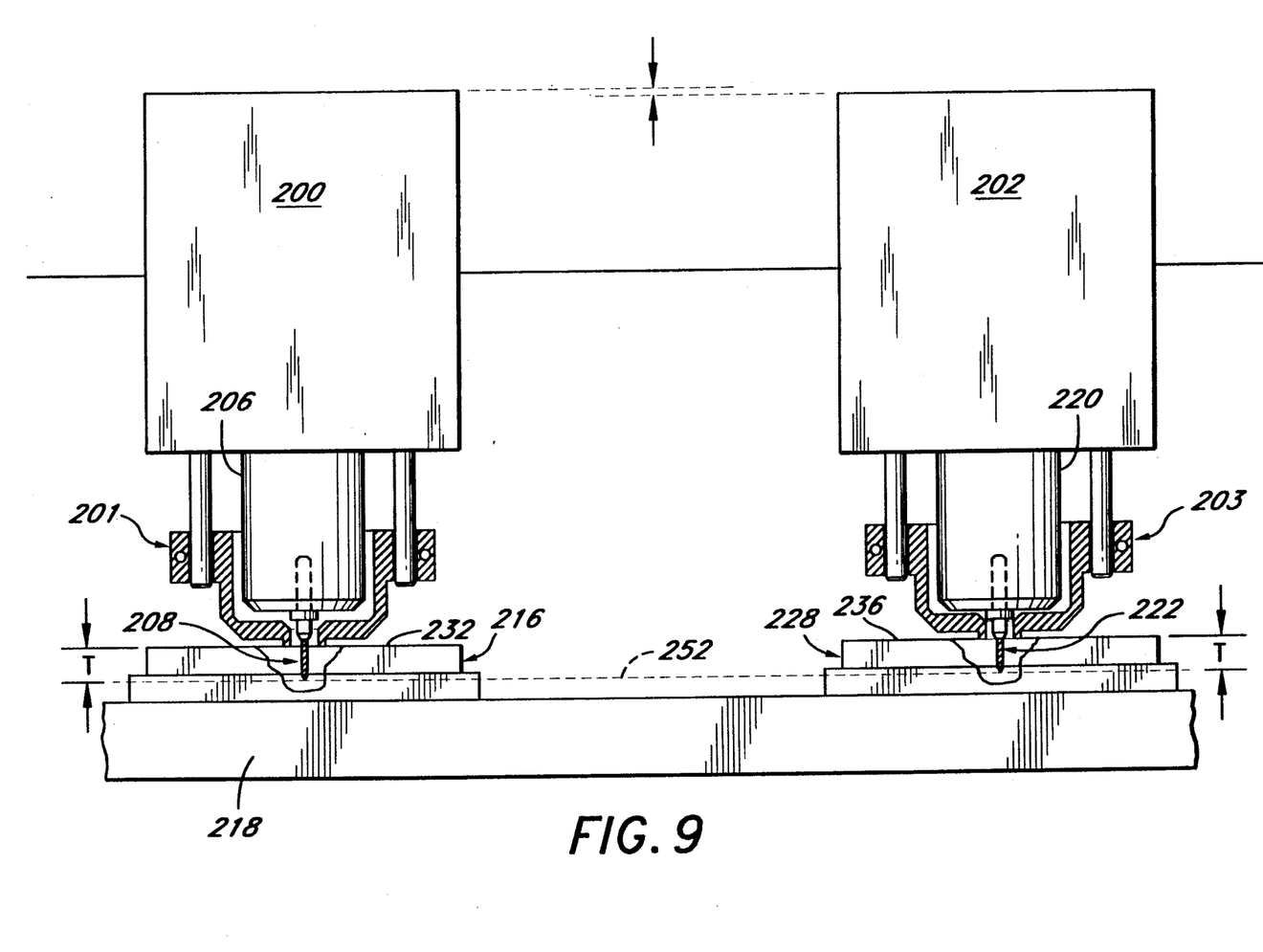
FIG. 9 is a schematic elevational view of the multi-spindle drill tool arrangement shown in FIG. 8 after completion of a downward drilling stroke.

FIGS. 9 and 10 illustrate an improved method for through-drilling. In accordance with the present invention, the time required for each spindle of a multi-spindle drilling machine to drill holes, such that even the shortest drill tool extends completely through its workpiece a sufficient distance to ensure the creation of a uniform drill hole, is reduced by equalizing the length of the drill stroke for each spindle. Advantageously, this method permits the time required for all the spindles to complete a given drilling operation to be minimized by providing for an optimized minimum drill stroke length for all spindles. Thus, no time is wasted by having any spindle waiting for the completion of the drilling stroke by another spindle.

Figure 8:
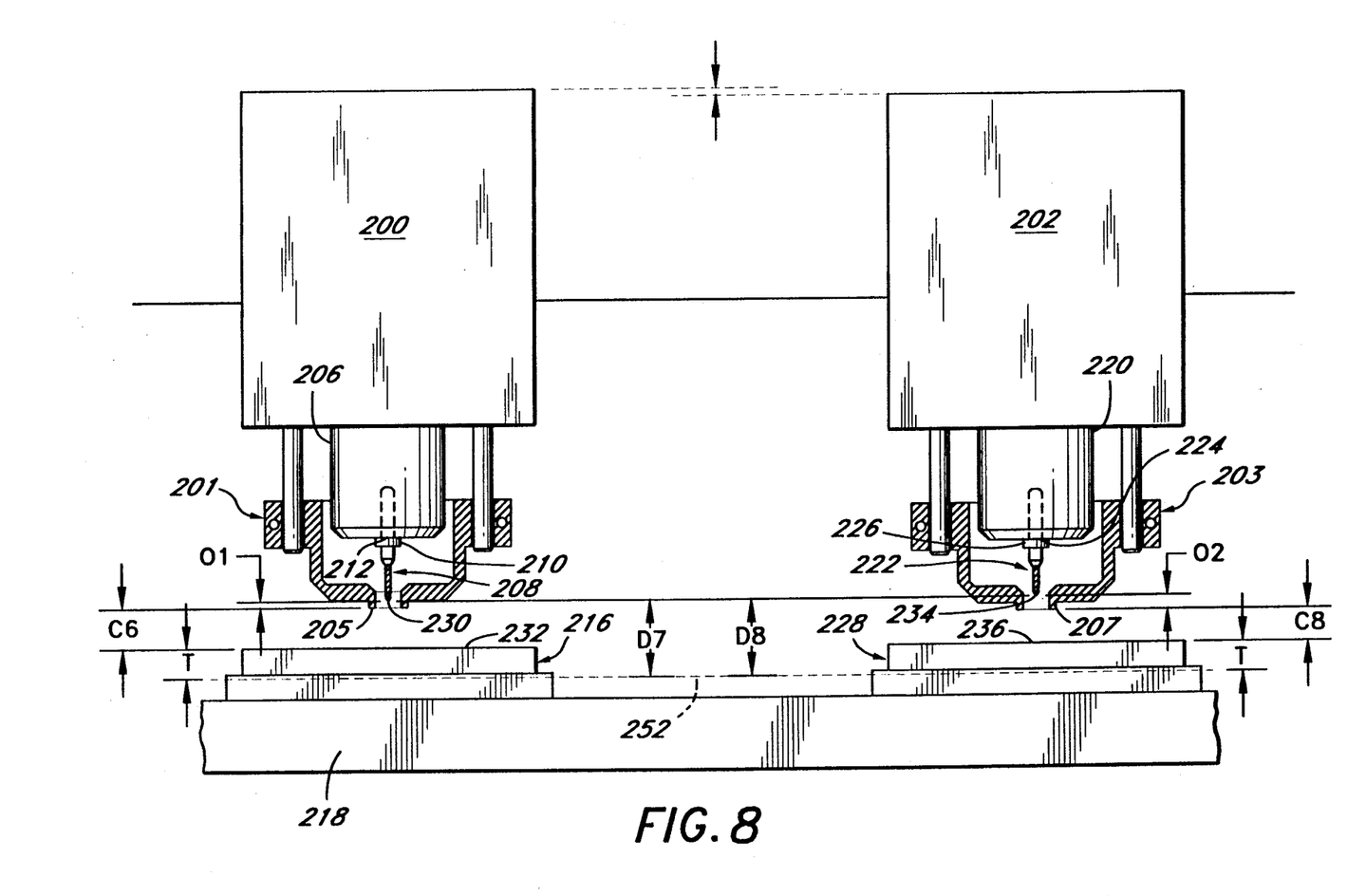
FIG. 8 is a schematic elevational view of a multi-spindle drill tool arrangement above a workpiece in accordance with the present invention prior to drilling.

FIG. 8 shows the identical hardware as described above in connection with FIGS. 6-7. For simplicity, like elements have been given like numerals. FIG. 8, however, shows the spindles 200 and 202 in a first position, different from the home position in accordance with the present invention. In this first position, as in the home position, the tip 230 of the first work tool 208 is spaced a nominal offset distance $O_1$ above the bottom surface 205 of the first pressure foot 201, and the tip 234 of the second drill tool 222 is spaced a somewhat longer offset distance $O_2$ above the bottom surface 207 of the second pressure foot 203. Likewise, in this first position, as in the home position, the desired distance T each of the spindles 200 and 202, are to move from the upper surface of its respective workpiece, 216, 228 to ensure that the shorter second drill tool 222 will extend completely through its workpiece 208 and into the backing material a sufficient distance to ensure the creation of a uniform drill through-hole is equal. Further, the bottom surface 205 of the first pressure foot 201 is spaced a clearance distance, C6, above the top surface 232 of the first workpiece 216, which will generally be equal to the clearance distance C in the home position. However, in contrast to the home position, the bottom surface 207 of the second pressure foot 203 is spaced a clearance distance $C_8$ above the top surface 236 of the second workpiece 228, which is shorter than the clearance distance $C_6$ between the bottom surface 205 of the first pressure foot 203 and the top surface 232 of the first workpiece 216. This clearance distance $C_8$ will generally be shorter than the clearance distance C. Importantly, however, this clearance distance $C_8$ is chosen so that the offset distance $O_1$ added to the clearance distance $C_6$ is equal to the offset distance $O_2$, plus the clearance distance $C_8$. That is, $O_1 + C_6 = O_2 + C_8$. As a result, since the total distance $D_7$ moved by the first spindle from the first position to the bottom end of the drill stroke is equal to $O_1 + C_6 + T$, and the total distance $D_8$ moved by the second spindle from the first position to the bottom end of the drill stroke is equal to $O_2 + C_8 + T$, then $D_7 = D_8$. Thus, the drill stroke lengths are equal.

This method permits the throughput of the drilling machine 204 to be substantially increased. Specifically, the distance the spindles holding the longer drill tools, such as the first spindle 200 holding the first drill 208, on the downstroke can be decreased, thereby preventing excess wear and tear on the drill tool, and the excess movement of the spindles holding the shorter drill tools, such as spindle 202 holding drill tool 222, on the upstroke can be reduced, avoiding the unnecessary movement of the tip 234 of the drill tool. Thus, no time is wasted at the beginning or the end of the drill stroke waiting for one of the spindles to move to compensate for a shorter drill tool. Over thousands and thousands of drill strokes, such time savings can be substantial.

Having described the invention in connection with certain specific embodiments thereof, it is to be understood that further modifications may now suggest themselves to those skilled in the art, and it is intended to include such modifications as fall within the scope of the claims hereof.

I claim:

1. A method of rapidly drilling holes in workpiece on a drilling machine, said drilling machine having a first and second spindle movable at least in a vertical direction, a first and second drill tool mounted in said first and second spindle, respectively, said first and said second spindle being adapted to cause rotation of said first and second drill tools to effect drilling, said drill tools depending varying lengths below said respective spindles, a worktable positioned beneath said spindles on which a workpiece can be mounted, said method comprising the steps of:

prior to conducting a drill stroke, sensing the actual vertical position of a tip of said first drill tool and a tip of said second drill tool;

designating an upper limit for said first spindle and an upper limit for said second spindle such that said tips of said first and second drill tools are positioned an equal distance above said worktable; and, advancing said first and second spindles through a drilling stroke.

2. A method of rapidly drilling holes in workpiece on a drilling machine, said drilling machine having a first and second spindle movable at least in a vertical direction, a first and second drill tool mounted in said first and second spindle, respectively, said first and said second spindle being adapted to cause rotation of said first and second drill tools to effect drilling, each of said drill tools having a tip depending a length below its respective spindle, a worktable positioned beneath said spindles on which a workpiece can be mounted and a first and second pressure foot mounted on said first and second spindle, respectively, and movable in a vertical direction relative to said respective spindles, each said pressure foot having a bottom surface adapted to engage a workpiece mounted on said worktable having a top surface, said method comprising the steps of:

selecting a workpiece having a thickness;

defining a nominal vertical home position for said first and second spindles such that in said home position there is a nominal clearance distance between said bottom surface of said pressure foot of said first and second spindle and said top surface of said workpiece;

measuring a drill tool offset distance for said first and second spindle, said drill tool offset distance for a given spindle being the distance between said bottom surface of said pressure foot of said spindle and said tip of said drill tool mounted in said spindle;

compensating for said drill tool offset distances by designating a vertical upper limit for said first spindle and a vertical upper limit for said second spindle such that when said first and second spindles are at their respective upper limits, the tips of their respective drill tools are positioned an equal distance from said top surface of said worktable;

advancing said drilling spindles downward through a vertical drilling stroke to a lower limit; and, returning said drilling spindles upward to their respective upper limits.

3. The method of claim 2, wherein said lower limit is a fixed distance below said upper surface of said workpiece less than said thickness of said workpiece.

4. The method of claim 2, wherein said workpiece is mounted on back-up material and said lower limit is a fixed distance below said upper surface of said workpiece greater than said thickness of said workpiece, so that each of said drill tools penetrate a sufficient distance into said back-up material that bores formed by said drill tools in said workpiece will have a uniform cross-section.

5. The method of claim 2, wherein said compensating step is performed by setting said upper limit of one of said first spindle and said second spindle a distance from said nominal home position equal to the difference between the offset distance of said first spindle and the offset distance of said second spindle.

6. The method of claim 5, wherein said lower limit is a fixed distance below said upper surface of said workpiece less than said thickness of said workpiece.

7. The method of claim 5, wherein said workpiece is mounted on back-up material and said lower limit is a fixed distance below said upper surface of said workpiece greater than said thickness of said workpiece, so that each of said drill tools penetrate a sufficient distance into said back-up material that bores formed by said drill tools in said workpiece will have a uniform cross-section.

8. The method of claim 2, wherein said compensating step is performed by setting said upper limit of said first spindle a distance downward from said nominal home position of said first spindle equal to said first drill tool offset distance and setting said upper limit of said second spindle a distance downward from said nominal home position of said second spindle by a distance equal to said second drill tool offset distance.

9. The method of claim 8, wherein said lower limit is a fixed distance below said upper surface of said workpiece less than said thickness of said workpiece.

10. The method of claim 8, wherein said workpiece is mounted on back-up material and said lower limit is a fixed distance below said upper surface of said workpiece greater than said thickness of said workpiece, so that each of said drill tools penetrate a sufficient distance into said back-up material that bores formed by said drill tools in said workpiece will have a uniform cross-section.

11. A drilling machine in which the length of the drill stroke can be adjusted to improve the throughput of said drilling machine, said drilling machine comprising;

a first spindle movable at least in a vertical direction, a first drill tool removably mounted in said first spindle, a tip of said first tool being positioned a nominal distance from the bottom of said first spindle, said first spindle being adapted to cause rotation of said first drill tool to effect drilling;

a second spindle movable at least in a vertical direction, a second drill tool removably mounted in said second spindle, a tip of said second tool being positioned a nominal distance from the bottom of said second spindle, said second spindle being adapted to cause rotation of said second drill tool to effect drilling;

a vertical position sensor which senses the absolute vertical position of said spindles and drill tools;

a worktable positioned beneath said first and second spindle, said worktable adapted to have a workpieces mounted thereon, said worktable being movable in at least one direction in a horizontal plane so as position said workpieces at desired locations beneath said spindles;

a first pressure foot mounted on said first spindle and movable in a vertical direction relative to said first spindle, a bottom surface of said first pressure foot adapted to engage a workpiece which is mounted on said worktable, said first drill tool passing through an aperture in said first pressure foot during drilling operations;

a second pressure foot mounted on said second spindle and movable in a vertical direction relative to said second spindle, a bottom surface of said second pressure foot adapted to engage a workpiece which is mounted on said worktable, said second drill tool passing through an aperture in said second pressure foot during drilling operations;

a first relative movement sensor which senses relative vertical movement between said first spindle and said first pressure foot, said first relative movement sensor sensing movement of said first pressure foot which occurs upon initial contact between said first pressure foot bottom surface and a workpiece;

a second relative movement sensor which senses relative vertical movement between said second spindle and said second pressure foot, said second relative movement sensor sensing movement of said second pressure foot which occurs upon initial contact between said second pressure foot bottom surface and a workpiece;

a computer controller which controls operation of said drilling machine, and which receives input from said first and second vertical position sensors and said first and second relative movement sensors, said controller comprising;

a computer memory for storing data sensed by said relative movement sensor regarding the drill tool offset position for each spindle;

means for calculating the difference between the drill tool offset positions for each spindle, said drill tool offset positions equal to being the distance between said bottom surface of said pressure foot of said spindle and said tip of said drill tool mounted in said spindle; and, means for controlling the vertical displacement of said spindles during a drill stroke, said control means adapted to set an upper limit for said first spindle and an upper limit for said second spindle having a distance between said upper limits equal to said difference between said drill tool offset positions.

* * * * *